US 7,160,786 B2

(12) United States Patent  
Kimura

(10) Patent No.: US 7,160,786 B2  
(45) Date of Patent: Jan. 9, 2007

(54) SILICON ON INSULATOR DEVICE AND LAYOUT METHOD OF THE SAME

(75) Inventor: Yoshitaka Kimura, Chiba (JP)

(73) Assignee: Kawaski Microelectronics, Inc., Chiba (JP)

( * ) Notice: Subject to any disclaimer, the term of this patent is extended or adjusted under 35 U.S.C. 154(b) by 41 days.

(21) Appl. No.: 10/956,094

(22) Filed: Oct. 4, 2004

(65) Prior Publication Data

US 2005/0042806 A1 Feb. 24, 2005

Related U.S. Application Data

(62) Division of application No. 10/280,022, filed on Oct. 25, 2002, now Pat. No. 6,815,771.

(30) Foreign Application Priority Data

Oct. 29, 2001 (JP) ............................. 2001-330276

(51) Int. Cl.  
*H01L 21/76* (2006.01)
(52) U.S. Cl. .................... 438/403; 438/14; 438/237; 438/527; 257/E27.112; 257/E21.545; 257/E27.062; 257/E21.191
(58) Field of Classification Search ................ 438/14, 438/403, 237, 328, 380, 979, 519, 527, 533, 438/149, 155; 716/1, 7, 8, 17, 18, FOR. 489, 716/FOR. 490; 257/48, 52, 356, 361, E27.112, 257/21.545, E21.561, E21.191
See application file for complete search history.

(56) References Cited

U.S. PATENT DOCUMENTS

| | | | |
|---|---|---|---|
| 4,149,176 A * | 4/1979 | Satou et al. ................ 257/373 |
| 4,889,829 A | 12/1989 | Kawai | |
| 4,965,872 A | 10/1990 | Vasudev | |
| 5,650,651 A | 7/1997 | Bui | |
| 5,744,838 A | 4/1998 | Matsuo et al. | |
| 5,852,317 A | 12/1998 | Berman | |
| 6,084,270 A | 7/2000 | Yamada | |
| 6,150,261 A | 11/2000 | Hsu et al. | |
| 6,188,122 B1 | 2/2001 | Davari et al. | |
| 6,191,020 B1 | 2/2001 | Liu et al. | |
| 6,215,155 B1 | 4/2001 | Wollesen | |
| 6,255,695 B1 | 7/2001 | Kubota et al. | |
| 6,292,927 B1 | 9/2001 | Gopisetty et al. | |
| 6,303,414 B1 | 10/2001 | Ang et al. | |
| 6,313,508 B1 | 11/2001 | Kobayashi | |
| 6,392,277 B1 | 5/2002 | Mitani et al. | |

(Continued)

FOREIGN PATENT DOCUMENTS

EP 0622850 A1 2/1994

(Continued)

OTHER PUBLICATIONS

Statement of Relevance for JP A 7-106579, no date.

*Primary Examiner*—Michelle Estrada  
*Assistant Examiner*—Quovaunda Jefferson  
(74) *Attorney, Agent, or Firm*—Oliff & Berridge, PLC

(57) ABSTRACT

A silicon on insulator (SOI) semiconductor device includes a wire connected to doped regions formed in an active layer of a SOI substrate. A ratio of the area of the wire to the doped region or a ratio of the area of contact holes formed on the wire to the doped region is limited to a predetermined value. When the ratio exceeds the predetermined value, a dummy doped region is added to prevent the device from being damaged during a plasma process.

14 Claims, 10 Drawing Sheets

U.S. PATENT DOCUMENTS

| | | |
|---|---|---|
| 6,393,603 B1 | 5/2002 | Noguchi |
| 6,421,816 B1 | 7/2002 | Ishikura |
| 6,432,726 B1 | 8/2002 | Iranmanesh |
| 6,437,455 B1 | 8/2002 | Mori et al. |
| 6,441,456 B1 | 8/2002 | Konishi et al. |
| 6,452,249 B1 * | 9/2002 | Maeda et al. ............... 257/531 |
| 6,475,838 B1 | 11/2002 | Bryant et al. |
| 6,498,372 B1 | 12/2002 | Brown et al. |
| 6,649,959 B1 | 11/2003 | Hsu et al. |
| 6,979,868 B1 | 12/2005 | Chen et al. |
| 2003/0057476 A1 * | 3/2003 | Morita et al. ............... 257/327 |
| 2003/0062573 A1 | 4/2003 | Murakami |

FOREIGN PATENT DOCUMENTS

| | | |
|---|---|---|
| JP | 04-280456 | 10/1992 |
| JP | 06-204467 | 7/1994 |
| JP | A 7-106579 | 4/1995 |
| JP | 10-335666 | 12/1998 |
| JP | 11-186394 | 7/1999 |
| JP | 11-204767 | 7/1999 |

* cited by examiner

SILICON ON INSULATOR DEVICE AND LAYOUT METHOD OF THE SAME

This is a Divisional of application Ser. No. 10/280,022 filed Oct. 25, 2002 now U.S. Pat. No. 6,815,771. The entire disclosure of the prior application is hereby incorporated by reference herein in its entirety.

INCORPORATION BY REFERENCE

The disclosure of Japanese Patent Application No. 2001-330276 filed on Oct. 29, 2001 including the specification, drawings and abstract is incorporated herein by reference in its entirety

BACKGROUND OF THE INVENTION

1. Field of Invention

This invention relates to semiconductor devices fabrication on silicon on insulator (SOI) substrates and to layout methods for such semiconductor devices.

2. Description of Related Art

Plasma etching, sputtering, plasma chemical vapor deposition (i.e., plasma CVD), ion implantation and other plasma processes are widely employed in fabrication of semiconductor devices.

During the plasma process, the surface of the semiconductor substrate is irradiated with charged particles (i.e., ions an electrons) in the plasma. When the semiconductor substrate has a metal wire on its surface, which is not connected to the substrate, electric charges enter and accumulate in the metal wire. In other words, a wire on the surface of the substrate acts as an antenna to collect charges from the plasma.

Such accumulated charges induce charging-up and cause damage to the devices. For example, if a gate electrode of a metal-oxide-semiconductor (MOS) device (MOS transistor) is connected to the metal wire, a gate insulating film below the gate electrode may be damaged. That is, a high voltage due to the charging up is applied to the gate insulating film and thereby degrades the quality of the semiconductor device and, further, causes dielectric breakdown.

Because the amount of accumulated charge increases in proportion to the area of the wire, the voltage applied to the gate insulating film also increases in proportion to the ratio of the area of the wire to the area of the gate insulating film. Therefore, when the ratio of the area of the wire to the area of the gate insulating film, or an "antenna ratio", exceeds a certain threshold value, the gate insulating film will be damaged.

Therefore, in the layout of semiconductor devices including MOS transistors, it is proposed to limit the antenna ratio between the area of the wire and that of the gate insulating film to be less than a predetermined value so that the gate insulating film is not damaged during a plasma process. For example, Japanese Unexamined Patent Publications Hei 8-97416 (U.S. Pat. No. 5,744,838), Hei 11-186394, and Hei 11-297836 (U.S. Pat. No. 6,421,816) disclose such method.

On the other hand, silicon on insulator (SOI) devices, in which MOS transistors are fabricated in an active layer on an insulating substrate, have been increasingly used in recent years. However, detailed investigation of an influence of the plasma process to the SOI device has not been reported.

SUMMARY OF THE INVENTION

Through extensive experimentations, this inventor has discovered that a different kind of antenna ratio should be taken into account in the layout of SOI devices. That is, different from the ratio between an area of a wire and a area of gate insulating film, which is known to determine the influence of plasma processes on conventional semiconductor devices, this inventor has discovered that a ratio between an area of a wire and an area of doped region, such as a source/drain region of a MOS transistor, mainly determine the influence on SOI devices.

In various exemplary embodiments according to the invention, a semiconductor device can include a silicon on insulator substrate having an active layer, at least one doped region formed in the active layer and that constitutes a source/drain region of a MOS transistor and an antenna wire formed in an antenna wiring layer. The antenna wire is electrically connected to the at least one doped region directly or through at least one connecting wire in at least one lower wiring layer below the antenna wiring layer. Moreover, a ratio of a total area of the antenna wire to a total area of the at least one doped region is limited within a range so that one of plasma processes to pattern the antenna wiring layer and to deposit an interlayer dielectric film covering the antenna wiring layer does not damage the MOS transistor.

The "antenna wiring layer" may be any one of wiring layers in the semiconductor device that is exposed to plasma during the fabrication of the device.

In various exemplary embodiments according to another embodiment of the invention, a semiconductor device can include a silicon on insulator substrate having an active layer, at least one doped region formed in the active layer and that constitutes a source/drain region of a MOS transistor, and an antenna wire formed in an antenna wiring layer. The antenna wire is electrically connected to the at least one doped region directly or through at least one connecting wire in at least one lower wiring layer below the antenna wiring layer. Moreover, an interlayer dielectric film that covers the antenna wiring layer having at least one connection hole for connecting to the antenna wire can be included. A ratio of a total area of the at least one connection hole to a total area of the at least one doped region is limited within a range so that a plasma process to form the connecting hole does not damage the MOS transistor.

In various exemplary embodiments according to another embodiment of the invention, a semiconductor device can include a silicon on insulator substrate having an active layer, at least one doped region formed in the active layer and an antenna wire formed in an antenna wiring layer. The antenna wire is electrically connected to the at least one doped region directly or through at least one first connecting wire in at least one lower wiring layer below the antenna wiring layer. Furthermore, a dummy doped region can be formed in the active layer electrically connected to the doped region through at least one second connecting wire in the antenna wiring layer and/or in the at least one lower wiring layer.

In various exemplary embodiments according to another embodiment of the invention, a layout method of a semiconductor device can include the steps of placing at least one doped region in an active layer of a silicon on insulator substrate, and placing an antenna wire in an antenna wiring layer electrically connected to the at least one doped region directly or through at least one first connecting wire in at least one lower wiring layer below the antenna wiring layer. The layout method can further include, when a ratio of a total area of the antenna wire to a total area of the at least one doped region exceeds a predetermined value, performing at least one of: (a) adding a dummy doped region in the active layer electrically connected to the doped region through at least one second connecting wire in the antenna wiring layer and/or in the at least one lower wiring layer; (b) adding a junction diode electrically connected to the doped region through at least one second connecting wire in the antenna wiring layer and/or in the at least one lower wiring layer; (c) dividing the antenna wire into two parts and electrically connecting the two parts through a third connecting wire in an upper wiring layer above the antenna wiring layer; and (d) dividing one of the antenna wire and the at least one first connecting wire into two parts, and inserting a buffer between the two parts.

In various exemplary embodiments according to another embodiment of the invention, a layout method of a semiconductor device can include the steps of placing at least one doped region in an active layer of a silicon on insulator substrate, placing an antenna wire in an antenna wiring layer electrically connected to the at least one doped region directly or through at least one first connecting wire in at least one lower wiring layer below the antenna wiring layer, and placing at least one connection hole for connecting to the antenna wire. The layout method can further include, when a ratio of a total area of the at least one connection hole to a total area of the at least one doped region exceeds a predetermined value, performing at least one of: (a) adding a dummy doped region in the active layer electrically connected to the doped region through at least one second connecting wire in the antenna wiring layer and/or in the at least one lower wiring layer; (b) adding a junction diode electrically connected to the doped region through at least one second connecting wire in the antenna wiring layer and/or in the at least one lower wiring layer; (c) dividing the antenna wire into two parts and electrically connecting the two parts through a third connecting wire in an upper wiring layer above the antenna wiring layer; and (d) dividing one of the antenna wire and the at least one first connecting wire into two parts, and inserting a buffer between the two parts.

DETAILED DESCRIPTION OF EXEMPLARY EMBODIMENTS

Before explaining preferred embodiment of this invention, influences of plasma processes on conventional semiconductor devices, which are formed on a surface of a bulk semiconductor substrate, will be explained.

Figure 8:
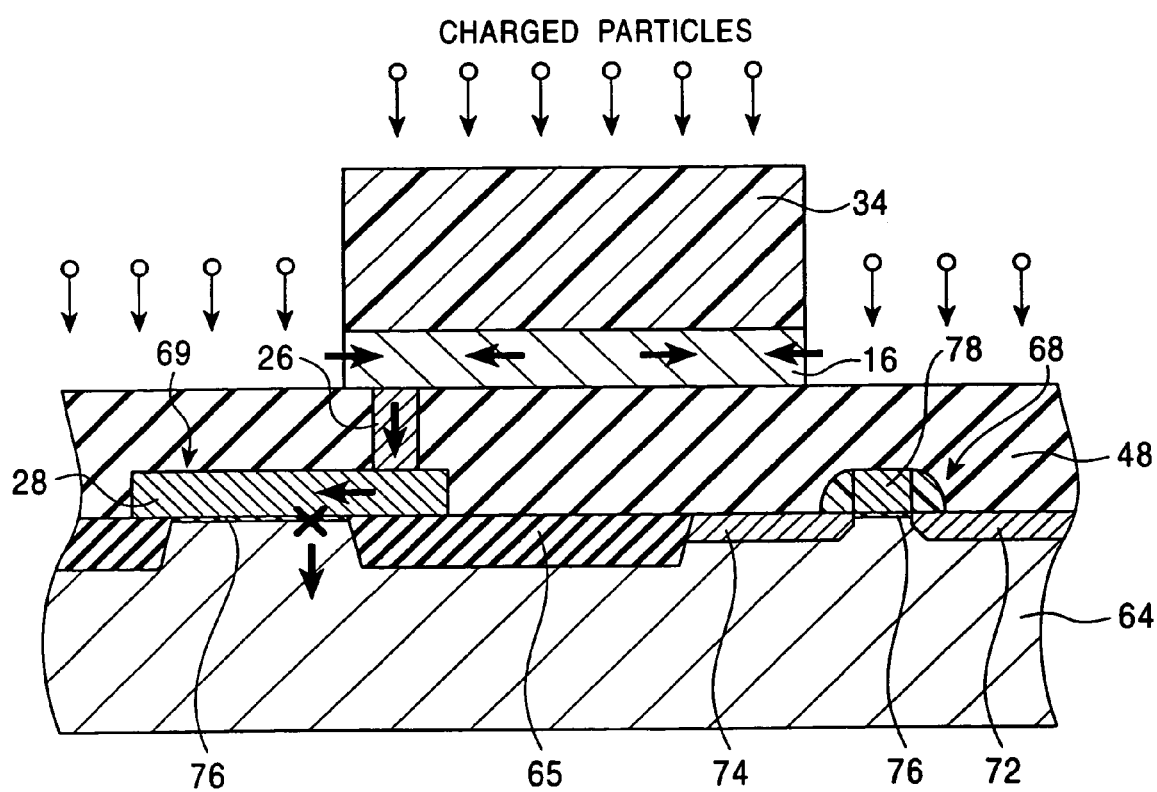
FIGS. 8 to 10 each show a sectional view of a conventional semiconductor device in which plasma damage occurs on its gate insulating film.
Figure 9:
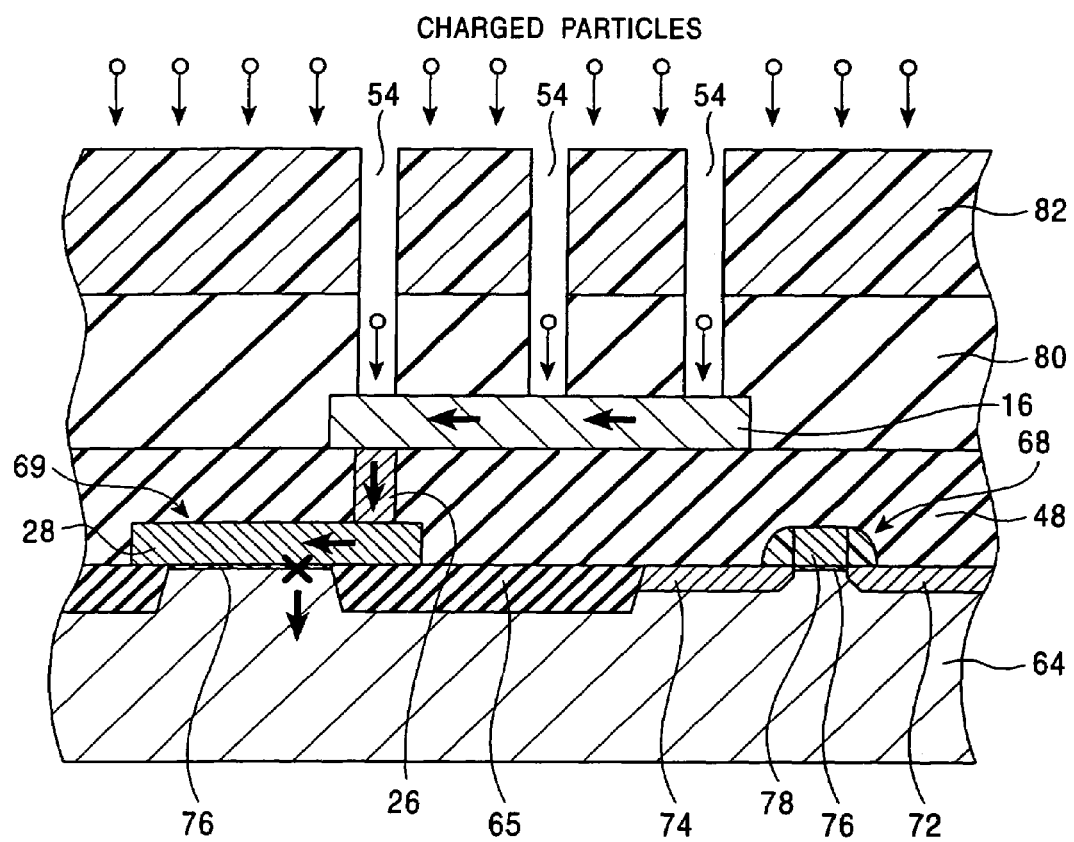
Figure 10:
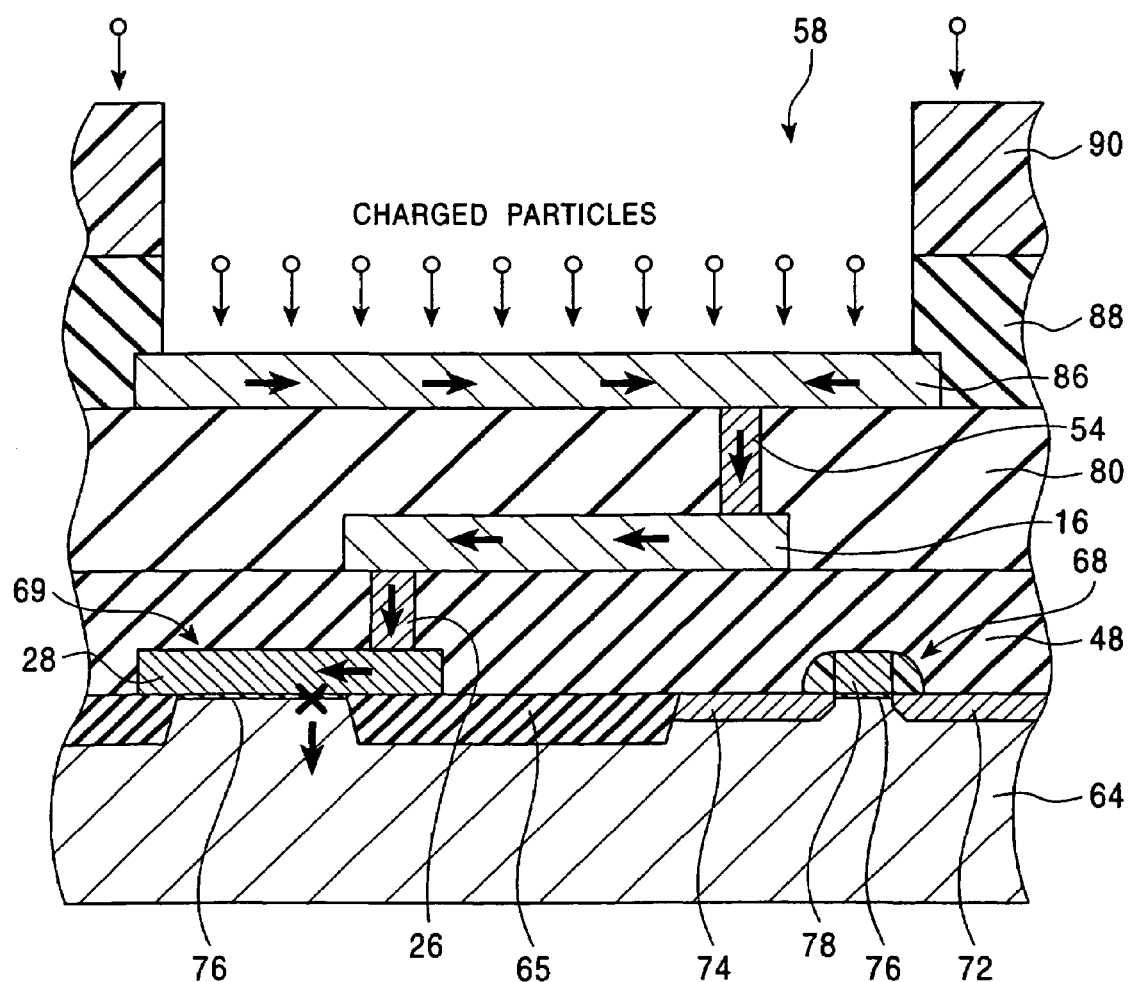

FIGS. 8 to 10 each show a sectional view illustrating a semiconductor device including a MOS transistor 69 formed on a surface of a bulk semiconductor substrate 64. In each of the figures, the gate insulating film 76 of a MOS transistor 69 is damaged by plasma. More specifically, FIG. 8 shows a plasma etching process to form a first metal wiring layer. FIG. 9 shows a plasma etching process to form second level contact holes subsequent to the process of FIG. 8. FIG. 10 shows a plasma etching process of a passivation film subsequent to the process of FIG. 9.

With reference to FIG. 8, two MOS transistors 68 and 69 are formed on a surface of a silicon substrate (i.e., a semiconductor substrate) 64 and are separated from each other with a field oxide film 65.

The MOS transistor 68 on the right of the figure includes two doped regions 72 and 74 on the surface of the silicon substrate 64. These doped regions 72 and 74 serve as a source and a drain of the MOS transistor 68, respectively. The MOS transistor 68 further includes a gate electrode 78 over the silicon substrate 64 between the doped regions 72 and 74. A gate insulating film (i.e., silicon oxide film) 76 is formed on the surface of the silicon substrate 64 and the gate electrode 78 is separated from the substrate 64 by the gate insulating film 76. The gate electrode 78 extends in a direction perpendicular to the paper plane.

The left MOS transistor 69 has a configuration the same as that of the right MOS transistor 68 except that it is rotated 90° and includes a gate electrode 28 extending laterally in the figure.

A first interlayer dielectric film 48 is disposed over the silicon substrate 64 having the two MOS transistors 68 and 69 and has a first level contact hole 26. The gate electrode 28 of the left MOS transistor 69 is connected via the first level contact hole 26 to a first level metal wire 16 disposed on the first interlayer dielectric film 48.

With reference to FIG. 8, a metal film for forming a first metal wiring layer including the metal wire 16 is deposited, a photoresist pattern 34 is formed on the deposited metal film, and plasma etching is performed using the photoresist pattern 34 as a mask.

In the plasma etching process, charged particles in the plasma enter into the metal film. Specifically, during an over etching after the wire 16 is separated from other portions of the metal film, charged particles enter into the metal wire 16 from the side surfaces of the metal wire 16 formed by the etching. The charges accumulate in the metal wire 16, the first contact hole 26, and the gate electrode 28 of the MOS transistor 69.

That is, the metal wire 16 acts as an antenna to collect charges during the etching or patterning of the first metal wiring layer. In other words, the first wiring layer is the antenna wiring layer, and the metal wire 16 is the antenna wire during the plasma etching of the first wiring layer. The amount of accumulated charges increases in accordance with the increase of the area of the side surfaces of the metal wire 16. If the amount of the accumulated charges exceeds a critical value, the gate insulating film 76 under the gate electrode 28 is damaged or destroyed.

With reference to FIG. 9, a second interlayer dielectric film 80 is formed over the surface of the semiconductor device carrying the metal wire 16 formed in the process step of FIG. 8. A photoresist pattern 82 is formed on the second interlayer dielectric film 80, and the second interlayer dielectric film 80 is subjected to a plasma etching using the photoresist pattern 82 as a mask. Thereby, a plurality of second level contact holes 54 is opened.

During an over etching of the plasma etching to open the second level contact holes 54, i.e., after a surface of the first level metal wire 16 is exposed at the bottoms of the second level contact holes 54, the charged particles enter the exposed surface of the first level metal wire 16. Charges accumulate in the first level metal wiring 16, the first level contact hole 26, and the gate electrode 28 of the left MOS transistor 69.

That is, the exposed portions of the first level metal wire 16 acts as an antenna during the plasma etching to open the contact holes 54. In other words, the first wiring layer is the antenna wiring layer, and the first level metal wire 16 is the antenna wire during the plasma etching to open the second level contact holes 54. The amount of accumulated charges increases in accordance with the area of the second level contact holes 54. If the amount of the accumulated charges exceeds a critical value, the gate insulating film 76 below the gate electrode 28 is damaged or destroyed.

Next, with reference to FIG. 10, a metal wire 86 in the second metal wiring layer serving as a pad is formed over the second interlayer dielectric film 80 including the second level contact hole 54 formed in the process of FIG. 9. A passivation film 88 is then formed over the surface of the semiconductor device carrying the second level metal wire 86. A photoresist pattern 90 is formed on the passivation film 88, and the passivation film 88 is subjected to plasma etching using the photoresist pattern 90 as a mask to open a pad opening 58.

In this plasma etching process, charged particles enter a surface of the metal wire 86 exposed at the bottom of the pad opening 58, and charges accumulate in the second level metal wire 86, the second level contact holes 54, the first level metal wire 16, the first level contact hole 26, and the gate electrode 28 of the left MOS transistor 69.

That is, the exposed portions of the metal wire 86 acts as an antenna during the plasma etching to open the pad opening 58. In other words, the second wiring layer is the antenna wiring layer, and the second level wire 86 is the antenna wire during the plasma etching to open the pad opening 58. The amount of accumulated charge increases in accordance with the area of the pad opening 58. If the amount of accumulated charges exceeds a critical value, the gate insulating film 76 under the gate electrode 28 is damaged or destroyed.

In this manner, a metal wire exposed to plasma serves as an antenna to collect charges from the plasma. Accordingly, a gate insulating film 76 is markedly damaged or destroyed when an area of a metal wire, which is connected to the gate electrode directly (i.e., only through a contact hole) or through another wire in one or more lower wiring layers, is increased. This phenomenon is generally called "an antenna effect". The area of the metal wire may be an area of an upper surface, side surfaces, or the both, of the wire, or an area of connection holes for connecting to the metal wire such as contact holes and pad openings formed on the metal wire, depending on the process sequence.

To prevent or minimize the damage induced by the antenna effect, a so called antenna rule is proposed. That is, a ratio (i.e., antenna ratio) between an area of a metal wire, which is connected to a gate electrode and acts as an antenna during a plasma process, and an area of the gate electrode is limited to equal to or lower than a predetermined value. If the ratio exceeds the predetermined value, a protective device such as a resistor or a diode is attached to the gate electrode.

This conventional antenna rule only applies to the case where the metal wire is not connected to the semiconductor substrate.

Figure 11:
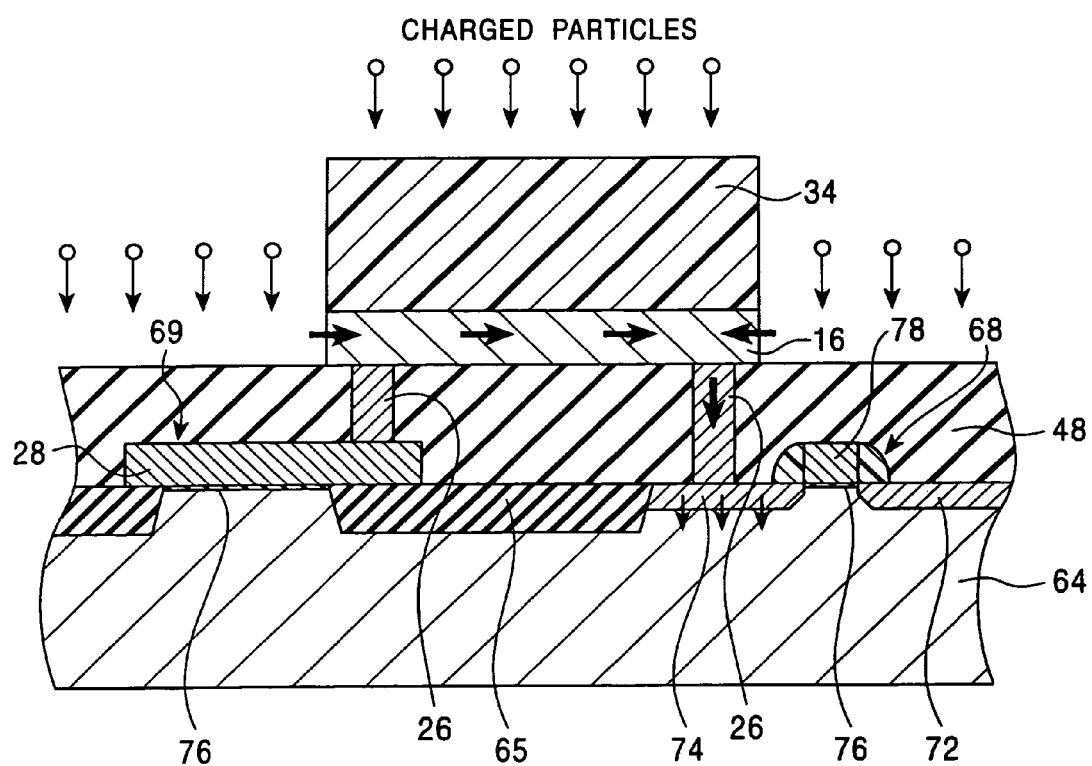
FIG. 11 shows a sectional view of a conventional semiconductor device in which plasma damage does not occur on its gate oxide.

With reference to FIG. 11, the metal wire 16 of the first metal wiring layer is connected to a doped region 74 on the surface of the semiconductor substrate 64. Then, charges entered from the plasma flow through the doped region 74 into the silicon substrate 64. Thus, a high voltage is not applied to the gate electrode 28, and thereby the gate insulating film 76 is not damaged.

It was discovered that, however, the situation is completely different in a SOI device.

Next, the influence of a plasma process on a SOI device will be explained.

Figure 12:
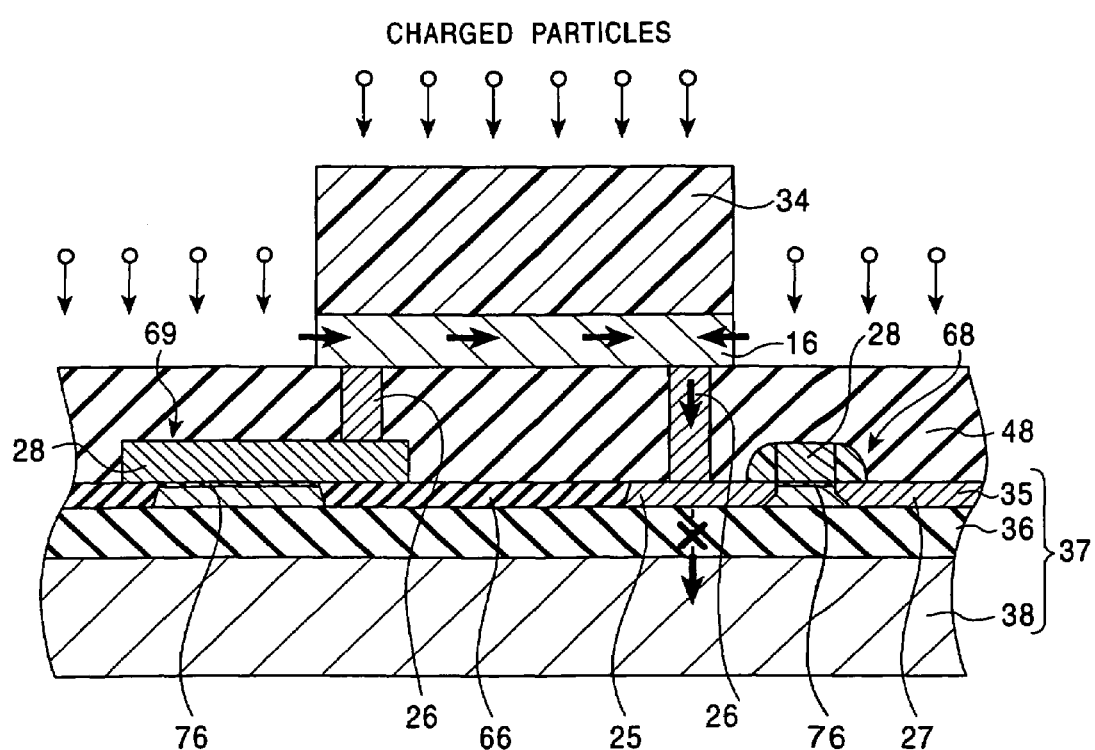
FIG. 12 is a sectional view of a semiconductor device using a SOI wafer in which plasma damage occurs on its buried oxide film.

FIG. 12 shows an example of SOI semiconductor device, in which two MOS transistors 68 and 69 are formed on an active layer 35 of an SOI substrate 37. The SOI substrate 37 has the active layer 35, a silicon substrate 38, and a buried oxide film 36 between the active layer 35 and the silicon substrate 38. A MOS transistor 68 is formed of a gate electrode 28, a gate insulating film 76, and doped regions 25 and 27 formed in the active layer 35.

As can be seen from FIG. 12, the doped region 74 is isolated from the silicon substrate 38 by the buried oxide film 36. Therefore, even though the metal wire 16 is connected to the doped region 25, the charges entered from the plasma do not flow into the substrate 38.

Moreover, it was discovered that the buried oxide film 36 is far more susceptible to the plasma damage than the gate insulating film 76. That is, the buried oxide film 36 may be seriously damaged even in cases that the gate insulating film 76 connected to the metal wire 16 is not significantly damaged.

This discovery is truly unexpected because the buried oxide film is far thicker than the gate insulating film. For a 0.2 µm design rule device, for example, the thickness of the buried oxide is about 100 nm or more, while the thickness of the gate insulating film is about 5 nm. That is, the buried oxide film is far more susceptible to the damage compared with the gate insulating film, even though the buried oxide film is more than 20 times thicker than the gate insulating film.

When the doped region constitutes a source/drain region of a MOS transistor as shown in FIG. 12, even a relatively small charging up that does not seriously damage the buried oxide film may damage the MOS transistor. That is, degradations of properties of the MOS transistor such as an increase of a leakage current between the source and drain regions, a change of the threshold voltage, and other problems may occur.

Thus, it has become evident that improved SOI devices that are prevented from being damaged by a plasma process are highly desired. Layout methods for providing such improved SOI devices are also highly desired.

Now, preferred embodiments of the semiconductor devices and layout methods for such semiconductor devices of this invention will be explained with reference to the attached drawings.

Figure 1:
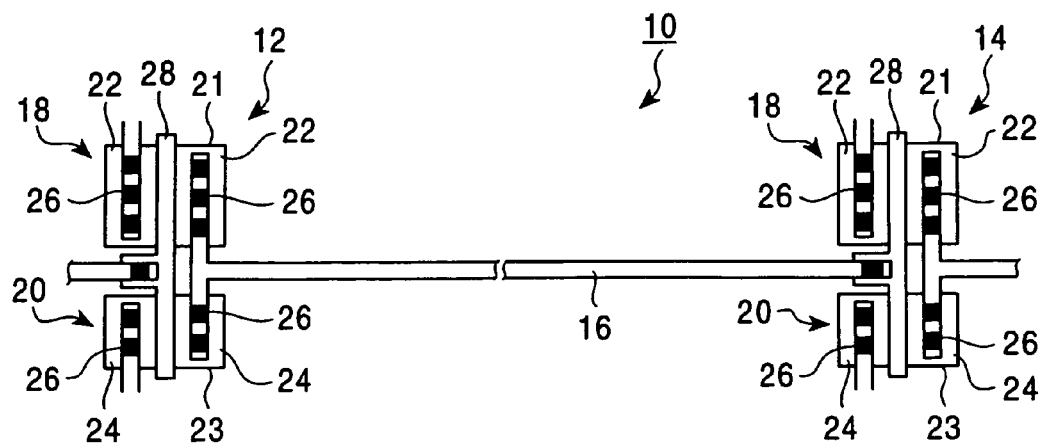
FIG. 1 shows an exemplary schematic layout of a semiconductor device according to a layout method of this invention.

FIG. 1 is an exemplary schematic layout of semiconductor device designed by the layout method of this invention.

With reference to FIG. 1, a semiconductor device 10 is a SOI device including MOS transistors formed on a surface of a SOI substrate. Specifically, two complementary MOS (CMOS) inverters 12 and 14 are arranged at a predetermined spacing and are connected with each other in series through a wire 16 in the antenna wiring layer. Each of the inverters 12 and 14 has P-type and N-type MOS transistors (MOSFETs) 18 and 20.

The SOI substrate has an active layer (i.e., semiconductor layer) insulated from a semiconductor substrate by a buried oxide film. Each of the MOS transistors has two doped regions constituting source/drain regions formed in the active layer of the SOI substrate. The SOI substrate may be formed by various methods such as Separation by Implanted Oxygen (SIMOX).

In each of the inverters 12 and 14, a gate electrode 28 is arranged to pass over a P-type and a N-type active region 21 and 23, which are regions of the active layer separated by the field isolation film. P-type and N-type doped regions 22 and 24 are formed on both sides of the gate electrode 28. The doped regions 22 and 24 on the left of the gate electrode 28 form source regions of the MOS transistors. The doped regions 22 and 24 on the right of the gate electrode 28 form drain regions of the MOS transistors. The source regions of the P-type and N-type MOS transistors are connected to a power-supply wiring and a ground wiring, respectively, via respective connection holes (first level contact holes) 26. Drain regions of the P-type and N-type MOS transistors are both connected to the first level metal wire 16 via respective first level contact holes 26.

In the semiconductor device 10 shown in FIG. 1, the ratio of the total area of the first level metal wire 16 to the total area of the P-type and N-type doped regions 22 and 24 connected to the first level metal wire 16, or the drain regions, is limited equal to or less than a predetermined value. As a result, damage, or a degradation of properties, of the P-type and N-type MOSFETs 18 and 20 during the processing (patterning) of the first level metal wire 16 is prevented. Damage during the plasma process for depositing the first interlayer dielectric film 48 (see FIG. 3) to cover the first level metal wire 16 is also prevented.

The term "total area of the first level metal wire 16" herein means a total area of the first level metal wire 16 exposed to plasma during a specific plasma process. That is, it means a total area of side surfaces in the process of patterning the first level metal wire 16, and a total of the top surface and side surfaces of the first level metal wire 16 in the process of depositing the second interlayer dielectric film covering the first level metal wire.

When a plurality of first level metal wires is connected in common to a doped region or doped regions, the total area of the metal wire is a sum of the areas for the plurality of metal wires. The term "area of the P-type and N-type doped regions 22 and 24" means a total top surface area of the doped regions 22 and 24 arranged in the active layer of the SOI wafer and connected to the first level metal wire 16 via the first level contact holes 26.

According to this embodiment, the ratio (i.e., antenna ratio) of the total area of the side surfaces of the first level metal wire 16 to the total area of the P-type and N-type doped regions 22 and 24 of the inverters 12 and 14 is set to be 100:1 or below. Accordingly, when the total area of the drain regions 22 and 24 of the inverters 12 and 14 is 4 $\mu m^2$, the upper limit of the total area of the first level metal wire 16 is 400 $\mu m^2$. If the first level metal wire 16 has a thickness of 0.4 $\mu m$, the length of the wire is limited equal to or less than 500 $\mu m$, i.e., 400/(0.4×2) $\mu m$.

By limiting the ratio of the total area of the first level metal wire 16 to the total area of the doped regions connected to the first level metal wire 16 equal to or less than a predetermined value, charges accumulated in the first level metal wire 16 and the doped regions 22 and 24 can be suppressed to or less than a certain value. Thus, the invention can prevent degradation of the properties of the P-type and N-type MOSFETs 18 and 20 during plasma processes such as the patterning step of the first wiring layer and the deposition step of the second interlayer dielectric film 80 (see FIG. 9).

Figure 2:
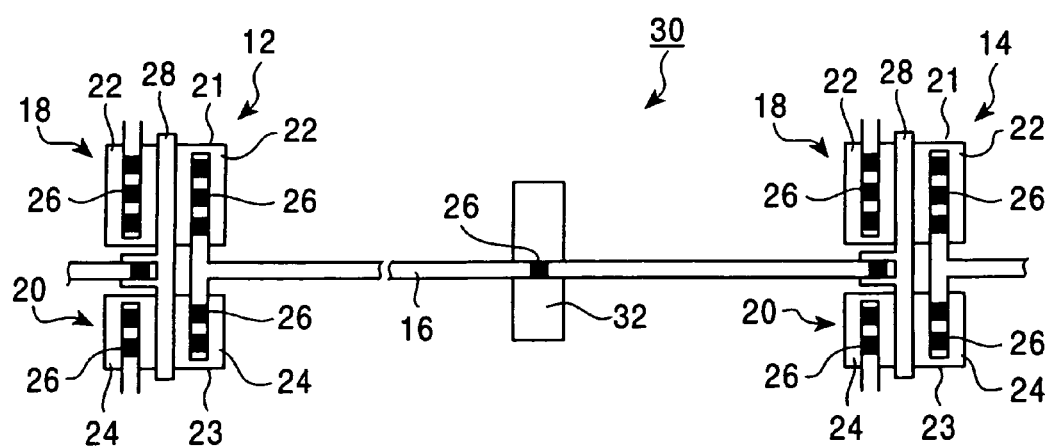
FIG. 2 shows another exemplary schematic layout of a semiconductor device according to the layout method of this invention.

FIG. 2 shows an exemplary schematic layout of another semiconductor device designed by the layout method of this invention.

With reference to FIG. 2, a semiconductor device 30 further includes a dummy doped region 32 in addition to the configuration of the semiconductor device 10 shown in FIG. 1.

The dummy doped region 32 is connected via a first level contact hole 26 to the first level metal wire 16, which connects between the two inverters 12 and 14. That is, the dummy doped region 32 is electrically connected in parallel with the doped regions 22 and 24 of the first inverter 12. The dummy doped region 32 is used as a capacitor element having a capacitance between the dummy doped region 32 and the semiconductor substrate 38.

U.S. Pat. No. 5,744,838 proposes to interpose a doped region, which functions as a diode and a resistor, between a gate electrode of a transistor and a wire for transmitting a signal from a preceding stage to prevent plasma damage in a conventional semiconductor device. In this case, the wire is divided into two parts and the doped region is connected in series with the two divided parts. That is, the doped region is connected to both of the divide parts of the wire, and is connected to both of the preceding stage and the gate electrode through respective parts of the divided wire.

In contrast, the dummy doped region 32 in the exemplary semiconductor device shown in FIG. 2 is connected in parallel with the doped regions 22 and 24 without cutting the wire 16. Therefore, the dummy doped region 32 does not function as a resistor. Further, the dummy doped region 32 is isolated from the silicon substrate 38 by the buried oxide film and does not function as a diode. That is, the dummy doped region 32 is used only as a capacitor element.

The dummy doped region 32 is connected to satisfy the limitation of the antenna ratio when it is determined that following first and/or second ratios exceed predetermined values respectively determined. The first ratio is a ratio of the total area of the first level metal wire 16 to the total area of the doped regions 22 and 24. The second ratio is a ratio of the total area of contact holes 54 arranged on the first level metal wire 16 to the total area of the doped regions 22 and 24.

By adding the dummy doped region 32, the total area of the doped regions, which is the sum of the areas of the doped region 22 and 24 and the area of the dummy doped region 32, is increased. And the antenna ratio is reduced to or less than the predetermined value.

In portions of the semiconductor device where the ratios highly possibly exceed the predetermined value, it is acceptable to connect the dummy doped regions 32 or other measures to reduce the antenna ratios without determination whether or not the ratios actually exceed the predetermined value. By this procedure, the degradation due to the plasma damage does not occur even when the ratios without the dummy doped regions actually exceed the predetermined value.

For example, a wire connecting between an output terminal of a circuit block in a semiconductor device and an input terminal of another circuit block of the same semiconductor device has a length of equal to or more than several millimeters in many cases. Accordingly, the ratio of the area of a wire connected to an output terminal to the area of doped regions of MOS transistors constituting the output terminal highly possibly exceeds the predetermined value.

Figure 3:
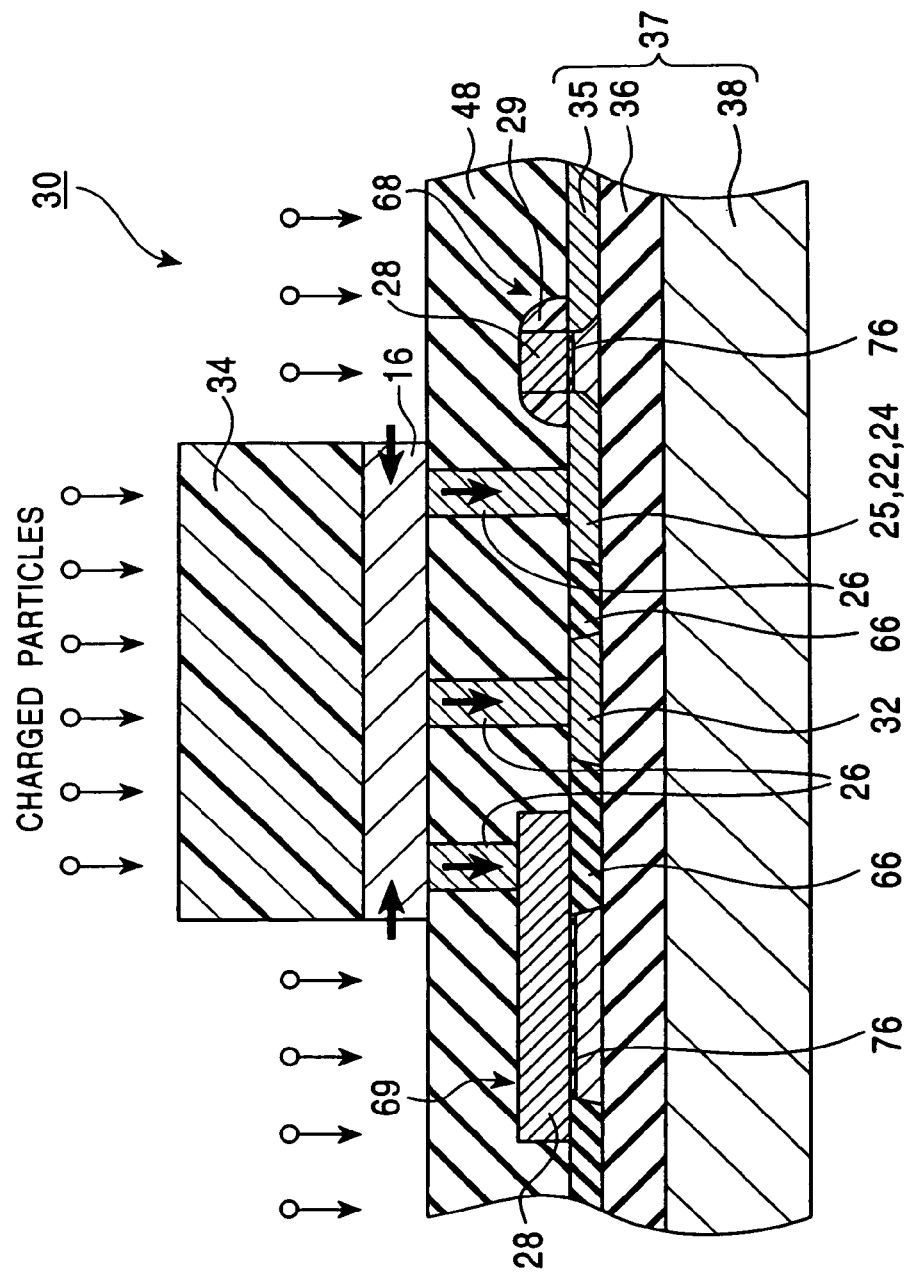
FIG. 3 is an exemplary sectional view of the semiconductor device shown in FIG. 2 as an embodiment of this invention.

FIG. 3 is an exemplary sectional view corresponding to the layout shown in FIG. 2. During the patterning step of the first metal wiring layer using a photoresist pattern 34 as a mask, charged particles enter the side faces of the patterned metal wire 16. The incident charges accumulate in the capacitor formed between the doped regions 25 (22 and 24) and the silicon substrate 38 to thereby apply a voltage across the buried oxide film 36. In this example, the bottom of the doped region 25 reaches the upper surface of the buried oxide film 36. Therefore, the voltage developed by the charge accumulation directly applies across the buried oxide film 36.

By adding the dummy doped region 32 in parallel with the doped regions 25 (i.e., the P-type and N-type drain doped regions 22 and 24 of the MOSFETs in the CMOS inverter 12), the total area of the doped regions can be increased. In other words, the antenna ratio determined by the area of the wire 16 and the total area of doped regions, which is a sum of the areas of the doped regions 25 and that of the dummy doped region 32, can thereby be reduced.

By increasing the total area of the doped regions, the total capacitance between the doped regions and the silicon substrate 38 can be increased. If an amount of electric charges entered during the plasma process is constant, the voltage applied to the buried oxide film 36 decreases by increasing the capacitor. Therefore, adding the dummy doped region 32 can prevent the degradation of the MOS transistor by decreasing the voltage applied to the buried oxide film 36.

The number of the dummy doped region 32 is not limited to one, and a plurality of dummy doped regions 32 can be connected in parallel to a single first level metal wire 16. When the area of the doped regions 22 and 24 is large enough, it is also possible to connect the dummy doped region 32 through another first level metal wire 16 via another first level contact hole 26.

Alternatively, a diode may be connected to the doped regions 22 and 24 instead of the dummy doped region 32.

Figure 4:
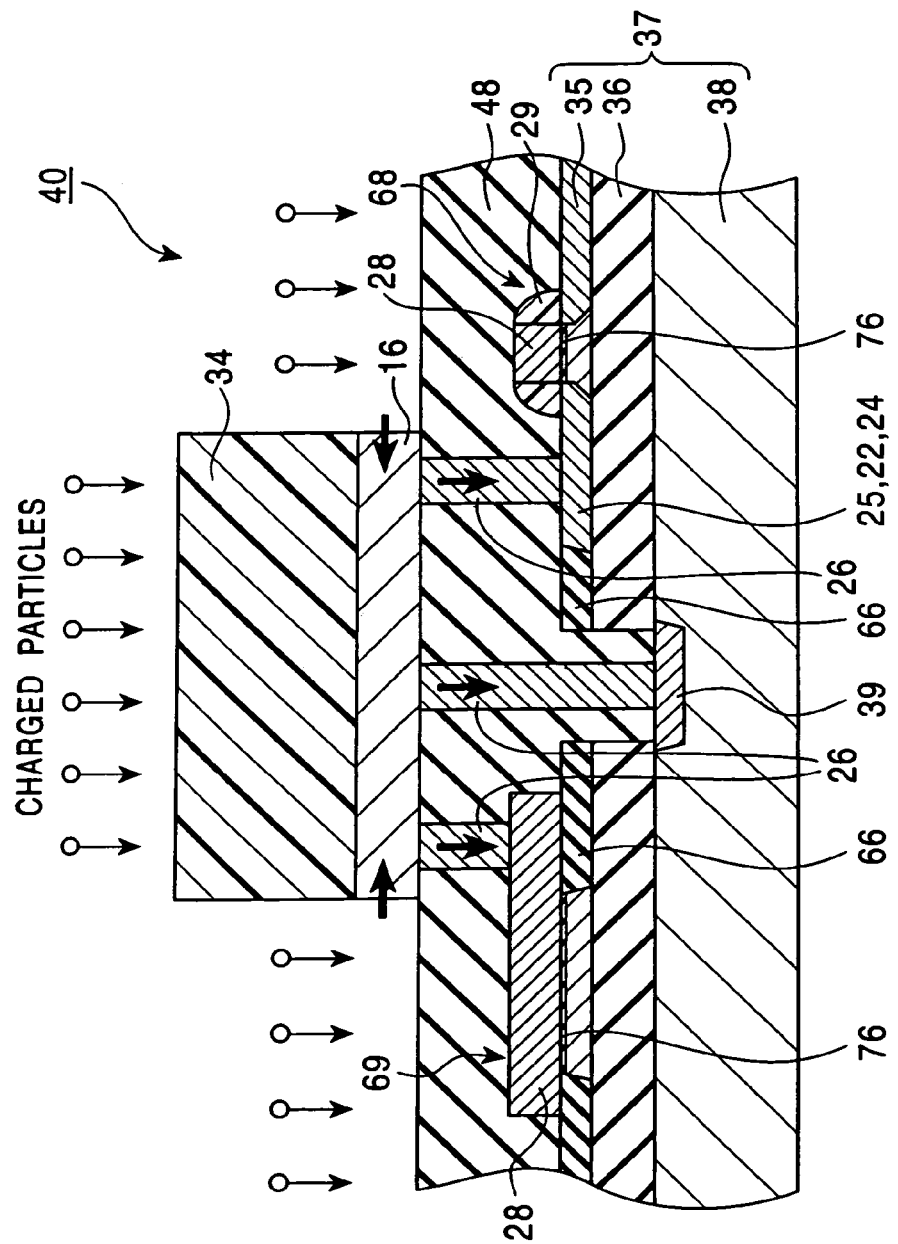
FIG. 4 is an exemplary sectional view of a semiconductor device as another embodiment of this invention.

Referring to FIG. 4, a semiconductor device 40 includes a diode (PN junction) formed between a doped region 39 and the substrate 38. In FIG. 4, an N-type doped region 39 is formed in the surface of a P-type substrate, as an example. The diode is electrically connected to the doped regions 22 and 24 through the first metal wire 16.

The semiconductor device 40 having N-type doped region 39 can be formed, for example, by following process steps.

First, a field isolation film 66 is formed in the active layer 35 to separate the active layer 35 into a plurality of active regions for forming respective MOS transistors. The field isolation film 66 may be formed by selectively oxidizing portions of the active layer 35. Alternatively, portions of the active layer may be removed and the removed portions are filled with, for example, a silicon oxide film deposited by chemical vapor deposition. Usually, the field isolation film 66 has a thickness such that the bottom of the field isolation film reaches the upper surface of the buried oxide film 36. In other words, the active layer 35 is completely oxidized or removed in the portion where the field isolation film 66 is formed.

Then, a gate insulating film 76 is formed on the surfaces of the active regions, and gate electrodes 28 and their sidewalls 29 of MOS transistors 68 and 69 are formed.

Next, a field isolation film 66 and a buried oxide film 36 in a portion where the N-type doped region 39 is to be formed are etched to form an opening. The field isolation film 66 and the buried oxide film 36 may be easily removed by a conventional oxide etching process, if the active layer is completely oxidized or removed during the field oxide formation step.

The N-type doped region 39 is then formed on the surface of the substrate 38 at the bottom of the opening simultaneously with N-type doped regions 24 constituting source/drain regions of the N-channel MOS transistors 68 and 69. Subsequently, an interlayer dielectric film 48 is deposited to cover the MOS transistors 68 and 69 and to fill the opening formed in the buried oxide film 36 and in the active layer 35. First level contact holes 26 for connecting to the source/drain regions or gate electrodes of the MOS transistors 68 and 69, and to the doped region 39 are simultaneously formed in the interlayer dielectric film 48.

The PN junction diode formed between the silicon substrate 38 and the N-type doped region 39 is connected in parallel to the capacitor formed between the doped regions 22 and 24 and the silicon substrate 38. When a voltage applied to the capacitor formed between the doped regions 22 and 24 and the silicon substrate 38 increases with increasing amount of electric charges entered and accumulated during the plasma process, electric current passes through the PN junction to thereby discharge the accumulated electric charges. Consequently, the voltage applied to the buried oxide 36 decreases to thereby prevent its dielectric breakdown.

Instead of adding the dummy doped region 32 or the junction diode, it is also acceptable to divide the first level metal wire 16 in two parts and to insert a buffer 42 between the divided parts.

Figure 5:
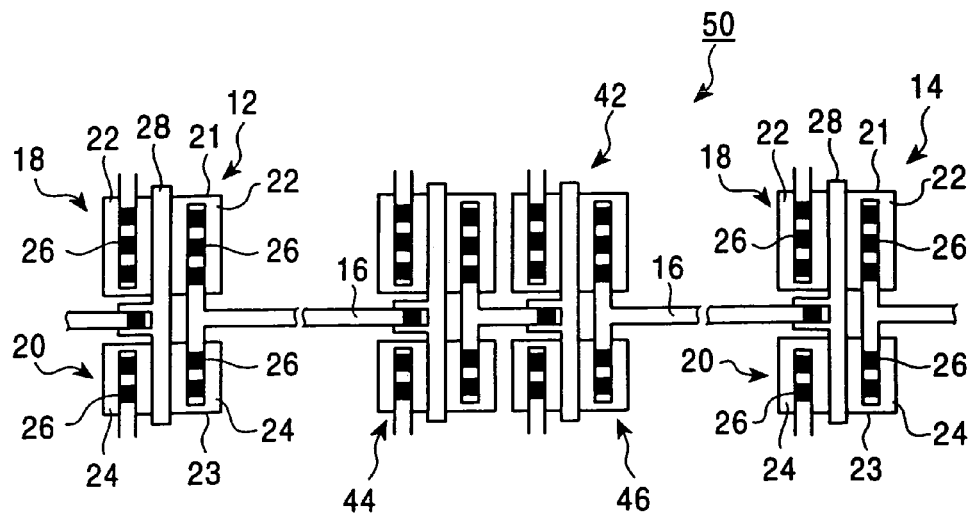
FIG. 5 shows yet another exemplary schematic layout of a semiconductor device according to the layout method of this invention.

Referring to FIG. 5, a semiconductor device 50 includes a buffer 42. The buffer 42 includes two MOS inverters 44 and 46 connected in series, and does not alter the logic. Dividing the first level metal wire 16 in two parts decreases the antenna ratio.

The number of the buffer 42 is not limited to one, and a plurality of buffers 42 may be connected in series between the inverters 12 and 14. If it is necessary to decrease the antenna ratio to or less than the predetermined value, the first level metal wire 16 may be divided in three or more parts and a plurality of buffers 42 may be inserted between the divided parts.

When the dummy doped region 32 is connected to the first level metal wire 16, an additional capacitance is added to the signal pass between the inverters 12 and 14. Therefore, a signal propagation delay increases. In contrast, the addition of the buffer 42 does not cause such increase of the signal propagation delay. However, the addition of the buffer 42 requires a larger area than that in the case of adding the dummy doped region 32.

Instead of adding the buffer 42 to the metal wire 16, it is also acceptable to divide the metal wire 16 into two parts and to connect the divided parts through a wire in an upper wiring layer above the first metal wiring layer. In this case, the wire of the upper wiring layer does not exist and the first level metal wire 16 is electrically divided when the first metal wiring layer is processed. Therefore, the antenna ratio is decreased and the amount of charges accumulated during the process is decreased.

Figure 6:
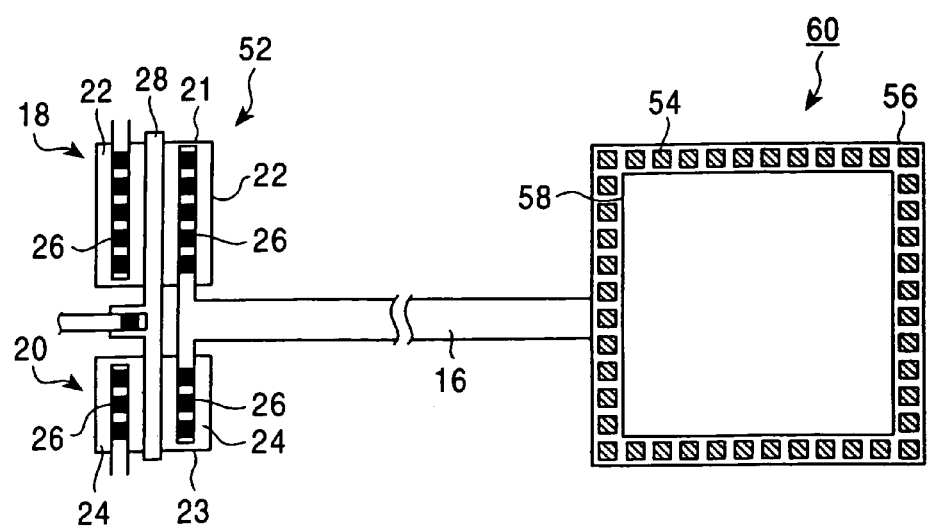
FIG. 6 shows another exemplary schematic layout of a semiconductor device according to the layout method of this invention.

FIG. 6 shows another schematic layout of a semiconductor device formed on a SOI substrate. The semiconductor device 60 has doped regions formed in the active layer 35 isolated from the silicon substrate 38 by a buried oxide film 36 (See FIG. 3).

The semiconductor device 60 includes a CMOS inverter 52 connected to a pad 56 through a first level metal wire 16. The inverter 52 has the same configuration as the inverters 12 and 14 shown in FIG. 1.

The pad 56 serves as an electrode to input and/or output signals to or from the semiconductor device 60. Square-shaped portions of the first level metal wire and a second level metal wire, which is stacked over the first level metal wire, form the pad 56. The second level contact holes 54 for connecting the first level metal wire to the second level metal wire are arranged along the periphery of the pad 56. A passivation film 88 (see FIG. 10) covers all over the upper surface of the semiconductor device 60 and is etched in a portion above the pad 56 to form a connection hole (i.e., pad opening) 58.

In the semiconductor device 60, the ratio (i.e., antenna ratio) of the total area of the second level contact holes 54 disposed over the first level metal wire 16 to the total area of the doped regions (P-type and N-type drain doped region 22 and 24) of the inverter 52 is limited equal to or less than a predetermined value. Thereby, the damage to the MOSFETs 18 and 20 during the process for forming the second level contact holes 54 is prevented.

When the second level contact holes have a fixed size, the upper limit of the antenna ratio may be set by the ratio between the number of the second level contact holes and the total area of the doped regions.

The plasma process that is used to form the contact hole includes a plasma etching of the second interlayer dielectric film 80 to form openings, a sputter etching to clean the surface of the first level metal wire exposed at the bottoms of the openings, and a sputtering to deposit a metal film in the openings. In any process, the total area of the second level contact holes 54 to be limited by the antenna rule is the total area of bottoms of the second level contact holes 54 on the first level metal wire 16.

The ratio of the area of the pad opening 58 to the P-type and N-type drain doped regions 22 and 24 is also limited equal to or less than a predetermined value. Thereby, damage to the P-type and N-type MOSFETs 18 and 20 during plasma processes for forming the pad opening 58 is prevented.

In this embodiment, the ratio of the number of the second level contact holes 54 to the total area of the P-type and N-type drain doped regions 22 and 24 is limited to five per 1 $\mu m^2$ or less. The ratio of the area of the pad opening 58 to the total area of the P-type and N-type drain doped regions 22 and 24 is limited to 100:1 or less. Accordingly, when the total area of the P-type and N-type drain doped regions 22 and 24 is 20 $\mu m^2$, the upper limits of the number of the second level contact holes 54 and the area of the pad opening 58 are 100 and 2000 $\mu m^2$, respectively.

By limiting the ratio of the total area of the second level contact holes 54 or the total area of the pad opening 58 to the total area of the P-type and N-type drain doped regions 22 and 24, the properties of the P-type and N-type MOSFETs 18 and 20 can be prevented from being degraded during plasma processes.

Figure 7:
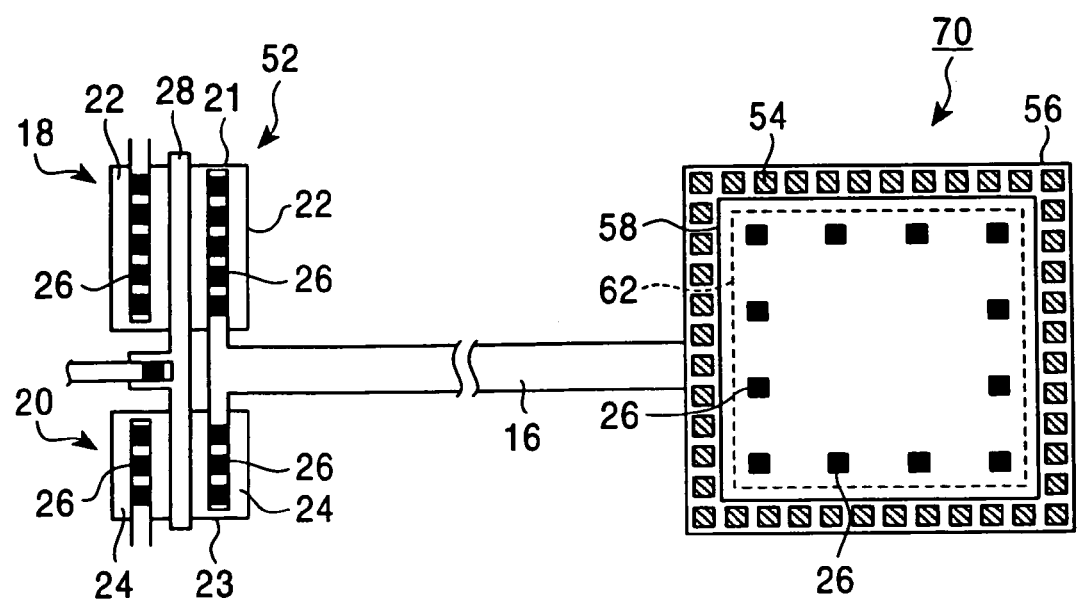
FIG. 7 shows another exemplary schematic layout of a semiconductor device according to the layout method of this invention.

FIG. 7 shows an exemplary schematic layout of another semiconductor device designed by the layout method of this invention. The semiconductor device 70 of FIG. 7 further includes a dummy doped region 62 in addition to the configuration of the semiconductor device 60 of FIG. 6.

In order the save the surface area of the SOI substrate, the dummy doped region 62 is placed below the pad 56. First level contact holes 26 are arranged over the dummy doped region 62 to connect the dummy doped region to the first level metal wire 16.

The dummy doped region 62 is thereby connected in parallel with the doped regions 22 and 24 through the first level metal wire 16, and serves as a capacitor element.

The dummy doped region 62 is added when one of following four ratios exceed predetermined values respectively determined. The first ratio is the ratio of the total area of the first level metal wire 16 to the total area of the doped regions 22 and 24. The second ratio is the ratio of the total area of the second level contact holes 54 on the first level metal wire 16 to the total area of the doped regions 22 and 24. The third ratio is the ration of the total area of the second level metal wire for forming the pad 56, which is connected to the doped regions 22 and 24 through the first level wire 16, to the total area of the doped regions 22 and 24. And the fourth ratio is the ratio of the total area of the pad opening 58 to the total area of the doped regions 22 and 24.

By connecting the dummy doped region 62 to the first metal wiring 16 in parallel with the P-type and N-type doped regions 22 and 24, the total capacitance increases to thereby reduce the antenna ratio.

Alternatively, a diode (PN junction) such as shown in FIG. 4 can be added instead of the dummy doped region 62.

The above embodiments have been illustrated by mainly taking the first level metal wire 16 as an example of an antenna to collect electric charges from plasma. In this case, the metal wire 16 is directly (i.e., only through a first level contact hole 26) connected to one or more doped regions 25. However, this invention can also be applied to the cases in which metal or other conductive wires in different wiring layers act as antennas.

When a semiconductor device has two or more metal wiring layers, a wire that acts as an antenna (an antenna wire) in an upper wiring layer (antenna wiring layer) exposed to plasma may be electrically connected to a doped region of a MOS transistor through one or more wires (first connecting wires) in one or more lower wiring layers. In some cases, a plurality of antenna wires in a same wiring layer is connected though one or more lower level metal wires to the same doped region or regions. In this case, the antenna ratio is determined based on the total area of the plurality of antenna wires in the same wiring layer.

When a dummy doped region or a junction diode is employed to reduce the antenna ratio, the dummy doped region or a junction diode is connected to the doped region through one or more wires (second connecting wires) in the one or more lower wiring layers. A wire in the antenna wiring layer, including the antenna wire itself, may also be used as a second connecting wire. Some or all of the first connecting wires may also be used as the second connecting wires.

When a buffer is employed to reduce the antenna ratio, any one of the antenna wire and the first connecting wires may be divided to insert the buffer.

Materials for wires of this invention are not specifically limited and include aluminum, tungsten, and other metals, as well as silicide, polycide, and other conductive materials.

The predetermined values of the antenna ratios highly depend on the specifications of the SOI wafer such as thickness of the buried oxide film, the type of a manufacturing apparatus used in plasma processes and manufacturing conditions. The values are not limited to the specific values described as examples in the embodiments. They can be determined appropriately to prevent the damage of the buried oxide film and MOSFETs.

To design a layout of an actual semiconductor device, the antenna ratio is automatically calculated. Portions of the layout where the determined ratios exceed the predetermined value are automatically extracted using an automatic placing and routing system as shown in U.S. Pat. No. 6,421,816, which is incorporated by reference in its entirety. These procedures are performed after placing circuit blocks (cells) and arranging routings between the circuit blocks. Thereafter, the automatic placing and routing system automatically select appropriate measures to satisfy the antenna rule in the extracted portions. It is also possible that an operator selects the appropriate measures.

The "total area" used in the determination of the antenna ratio may be different in different plasma processes. It is the total area of the side surfaces of the first level metal wire 16 in the patterning of the first level metal wire, while it is the total area of the upper and side surfaces of the first level metal wire 16 in the deposition of the second interlayer dielectric film over the first level metal wire 16.

The antenna ratios are preferably calculated for both of the total areas and are compared with respectively determined predetermined values. When plasma damage in one of the patterning and the deposition steps is far larger than that in the other, the total area corresponding to the process causing larger plasma damage alone can be calculated and compared with the predetermined value.

Alternatively, two antenna ratios can be separately calculated for the total areas of the upper surface and the side surfaces of the wire. And the calculated ratios can be compared with the predetermined values set in view of the damage due to both of the patterning and deposition steps.

Usually, the thickness of each wiring layer is fixed depending on a fabrication process used. Therefore, the area of the side surfaces can be calculated by the fixed thickness and the perimeter of the wire. In addition, the length of the wire can approximately determine the area of the side surfaces. Likewise, the length of wire can approximately determine the area of the upper surface when the width of the wire is substantially constant.

Accordingly, the calculation of the ratio of the total area of the wire to the area of the doped regions and its comparison with the predetermined value can be approximately substituted with the calculation of the ratio of the length of wire to the area of the doped regions and its comparison with a predetermined value set for that ratio.

The antenna ratio can be calculated for the overall semiconductor device or for portions where the antenna ratio may highly possibly exceed the predetermined value. For example, as explained previously, wires connecting between output terminals of circuit blocks and input terminals of different circuit blocks are likely to be very long, and are highly likely to have high antenna ratios. In this case, the antenna ratios can be approximately calculated by using the lengths of the wires of each wiring layer connected to the output terminals, because most of the MOS transistors constituting output terminals of the circuit blocks have almost the same size and therefore include doped regions having nearly the same area.

As explained previously, any one of the wiring layers that is exposed to plasma during the fabrication may become an antenna wiring layer. Therefore, antenna ratios can be calculated for wires in each wiring layer. Alternatively, antenna ratios can be calculated only for wires in selected layers where the antenna ratio may highly possibly exceed the predetermined value. For example, the long wires between circuit blocks, which are likely to have high antenna ratios, are usually formed in one or a few upper most wiring layers.

In short, it is not always necessary to calculate the exact value of the antenna ratio. The antenna ratio can be efficiently calculated by using various practical approximation procedures and can be compared with predetermined value set with margins according to the approximation procedure employed, as long as the damage due to plasma processes can be prevented.

The semiconductor devices according to the present invention can be prevented from damaging due to charging up during plasma processes and yield high reliability and improved production yields.

According to the layout method of this invention, the antenna ratio can be reduced and thereby the limitations on circuit design can be significantly decreased.

FIG. 4 illustrates, as an example, a semiconductor device in which a doped region 39 having a conductivity type opposite to that of the semiconductor substrate 38 is formed on the surface of the substrate 38. The doped region 39 is used to forms a diode for preventing the semiconductor device from being damaged during a plasma process.

Alternatively, doped region having the same conductivity type as that of the substrate can be formed on the surface of the substrate in a similar manner. The doped region of the same conductivity type can be connected through the first contact hole 26, the first level metal wire 16 and a metal wire in an upper wiring layer to a pad. The doped region can further be connected via a pad to a terminal of a package housing the semiconductor device. By using the terminal connected to the doped region as grounding terminal or a terminal for applying a specific voltage, the potential of the substrate can be fixed.

When a conventional semiconductor device using a SOI wafer is housed in a package in which the backside of the substrate is not connected to a package terminal, such as a flip chip ball grid array (BGA) package, the potential of the substrate cannot be fixed. Thus causing unstable operation of the semiconductor device due to a varying potential of the substrate.

Forming a doped region having the same conductivity type on the surface of the semiconductor substrate and connecting the doped region to a terminal of the package solve this problem while utilizing the conventional packaging technology.

The semiconductor devices and layout methods of semiconductor devices of this invention have basic configurations as above. While the invention has been described with reference to preferred embodiments thereof, it is to be understood that the invention is not limited to the preferred embodiments or constructions. To the contrary, the invention is intended to cover various modifications and equipment arrangements. In addition, while the various elements of the preferred embodiments are shown in various combinations and configurations, which are exemplary, other combinations and configurations, including more, less or only a single element, are also within the spirit and scope of the invention.

What is claimed:

1. A layout method of a semiconductor device on a silicon on insulator substrate having a semiconductor substrate and an active layer insulated from the semiconductor substrate by a buried oxide layer, the method comprising:

separating the active layer into a plurality of active regions by a field isolation film having a thickness such that a bottom of the field isolation film reaches an upper surface of the buried oxide film;

placing one or more first doped regions in first one or more of the plurality of active regions;

placing an antenna wire in an antenna wiring layer electrically connected to the one or more first doped regions directly or through at least one first connecting wire in at least one lower wiring layer below the antenna wiring layer; and when a ratio of a total area of the antenna wire to a total area of the one or more first doped regions exceeds a predetermined value, performing at least one of:

adding a dummy doped region in a second one of the plurality of active regions, the dummy doped region being electrically connected to the one or more first doped regions through at least one second connecting wire in the antenna wiring layer and/or in the at least one lower wiring layer;

adding a junction diode formed in a surface of the semiconductor substrate, the junction diode being electrically connected to the one or more first doped regions through at least one second connecting wire in the antenna wiring layer and/or in the at least one lower wiring layer;

dividing the antenna wire into two parts and electrically connecting the two parts through a third connecting wire in an upper wiring layer above the antenna wiring layer; and dividing one of the antenna wire and the at least one first connecting wire into two parts, and inserting a buffer between the two parts.

2. The method according to claim 1, wherein the one or more first doped regions are placed to form at least one source/drain region of a MOS transistor.

3. The method according to claim 1, wherein said performing adds the dummy doped region.

4. The method according to claim 3, wherein the dummy doped region functions only to form a capacitance between the dummy doped region and the semiconductor substrate.

5. The method according to claim 1, wherein the one or more first doped regions are placed to form at least one drain region of a MOS transistor that constitutes an inverter and the at least one drain region constitutes an output terminal of the inverter.

6. The method according to claim 5, wherein the antenna wire constitutes a signal pass between the inverter and another inverter.

7. The method according to claim 1, wherein the one or more first doped regions are placed to form at least one drain region of a MOS transistors that constitutes an output terminal of a circuit block.

8. A layout method of a semiconductor device on a silicon on insulator substrate having a semiconductor substrate and an active layer insulated from the semiconductor substrate by a buried oxide layer, the method comprising:

separating the active layer into a plurality of active regions by a field isolation film having a thickness such that a bottom of the field isolation film reaches an upper surface of the buried oxide film;

placing one or more first doped regions in first one or more of the plurality of active regions;

placing an antenna wire in an antenna wiring layer electrically connected to the one or more first doped regions directly or through at least one first connecting wire in at least one lower wiring layer below the antenna wiring layer;

placing at least one connection hole for connecting to the antenna wire; and when a ratio of a total area of the at least one connection hole to a total area of the one or more first doped regions exceeds a predetermined value, performing at least one of:

adding a dummy doped region in a second one of the plurality of active regions, the dummy doped region being electrically connected to the one or more first doped regions through at least one second connecting wire in the antenna wiring layer and/or in the at least one lower wiring layer;

adding a junction diode formed in a surface of the semiconductor substrate, the junction diode being electrically connected to the one or more first doped regions through at least one second connecting wire in the antenna wiring layer and/or in the at least one lower wiring layer;

dividing the antenna wire into two parts and electrically connecting the two parts through a third connecting wire in an upper wiring layer above the antenna wiring layer; and dividing one of the antenna wire and the at least one first connecting wire into two parts, and inserting a buffer between the two parts.

9. The method according to claim 8, the one or more first doped regions are placed to form at least one source/drain region of a MOS transistor.

10. The method according to claim 8, wherein said performing adds the dummy doped region.

11. The method according to claim 10, wherein the dummy doped region functions only to form a capacitance between the dummy doped region and the semiconductor substrate.

12. The method according to claim 8, wherein the one or more first doped regions are placed to form at least one drain region of a MOS transistor that constitutes an inverter and the at least one drain region constitutes an output terminal of the inverter.

13. The method according to claim 12, wherein the antenna wire constitutes a signal pass between the inverter and another inverter.

14. The method according to claim 8, wherein the one or more first doped regions are placed to form at least one drain region of a MOS transistor that constitutes an output terminal of a circuit block.

* * * * *